(12) United States Patent
Bae et al.

(10) Patent No.: US 7,772,763 B2
(45) Date of Patent: Aug. 10, 2010

(54) ORGANIC ELECTRO-LUMINESCENCE DISPLAY DEVICE COMPRISING GRID SHAPED AUXILIARY ELECTRODE

(75) Inventors: Sung Joon Bae, Seongnam-si (KR); Jae Yoon Lee, Seoul (KR); Joon Suk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 775 days.

(21) Appl. No.: 11/288,302

(22) Filed: Nov. 29, 2005

(65) Prior Publication Data
US 2006/0119259 A1 Jun. 8, 2006

(30) Foreign Application Priority Data
Dec. 2, 2004 (KR) ............ 10-2004-0100627
Dec. 29, 2004 (KR) ............ 10-2004-0115485
Sep. 21, 2005 (KR) ............ 10-2005-0087895

(51) Int. Cl.
H01J 1/62 (2006.01)
H01J 63/04 (2006.01)

(52) U.S. Cl. ............ 313/505; 313/500; 313/504; 313/506; 313/509

(58) Field of Classification Search ......... 313/498–512; 315/169.1, 169.3; 428/690–691, 917; 438/26–29, 438/34, 82; 257/40, 72, 98–100, 642–643, 257/759; 427/66, 532–535, 539
See application file for complete search history.

(56) References Cited

U.S. PATENT DOCUMENTS 6,790,540 B2* 9/2004 Mori et al. ............ 428/690
6,963,169 B2* 11/2005 Peng ............ 313/506
7,132,796 B2* 11/2006 Lee et al. ............ 313/610
7,385,348 B2* 6/2008 Park et al. ............ 313/512
2002/0011783 A1* 1/2002 Hosokawa ............ 313/504
2002/0014836 A1* 2/2002 Codama et al. ............ 313/504
2003/0094607 A1* 5/2003 Guenther et al. ............ 257/40
2004/0135496 A1* 7/2004 Park et al. ............ 313/504
2005/0017631 A1* 1/2005 Liedenbaum et al. ....... 313/505
2005/0040754 A1* 2/2005 Sakurai ............ 313/500
2005/0140285 A1* 6/2005 Park et al. ............ 313/506
2005/0140303 A1* 6/2005 Lee et al. ............ 315/169.3

FOREIGN PATENT DOCUMENTS

JP        2003045668 A   *   2/2003

* cited by examiner

*Primary Examiner*—Sikha Roy
*Assistant Examiner*—Jose M Diaz
(74) *Attorney, Agent, or Firm*—McKenna Long & Aldridge (57) ABSTRACT

An organic electro-luminance display device includes a first substrate and a second substrate; an array element on the first substrate, the array element including at least one thin film transistor (TFT) in each sub-pixel; a first electrode on the second substrate; a buffer on the first electrode including a first buffer at an outer region partitioning each sub-pixel and a second buffer at a region including a stepped portion of the first buffer, wherein a undercut structure is formed by the first and second buffers; an organic electro-luminescent layer in each sub-pixel partitioned by the second buffer; a second electrode formed on the organic electro-luminescent layer; and a conductive spacer for electrically connecting the TFT to the second electrode.

12 Claims, 10 Drawing Sheets

SiH4:NH3=1:3
(a)

SiH4:NH3=1:4
(b)

SiH4:NH3=1:6
(c)

ORGANIC ELECTRO-LUMINESCENCE DISPLAY DEVICE COMPRISING GRID SHAPED AUXILIARY ELECTRODE

This application claims the benefit of Korean Patent Application Nos. 2004-100627, filed on Dec. 2, 2004, 2004-115485, filed on Dec. 29, 2004, 2005-0087895, filed on Sep. 21, 2005, which are hereby incorporated by reference for all purposes as if fully set forth herein.

BACKGROUND OF THE INVENTION

1. Field of the Invention

The present invention relates to an organic electro-luminescence display device and a method for fabricating the same.

2. Discussion of the Related Art

Various kinds of flat panel display devices that can replace heavy and bulky cathode ray tubes (CRTs) have been recently developed. Examples of the flat panel display devices are liquid crystal display (LCD) devices, field emission display (FED) devices, plasma display panel (PDP) devices, and electro-luminescence display devices.

Many attempts have been actively made to improve the display quality of the flat panel displays and provide large-sized displays. Among them, the electro-luminescence display devices are self-luminous and display video images by exciting a phosphor material using carriers, such as electrons and holes. The electro-luminescence display devices are classified into inorganic electro-luminescence display devices and organic electro-luminescence display devices. While the inorganic electro-luminescence display devices require a high voltage of 100-200V, the organic electro-luminescence display devices can be driven at a low DC voltage of 2-20V. In addition, the organic electro-luminescence display devices have such advantages as wide viewing angle, rapid response time and high contrast ratio. Therefore, the organic electro-luminescence display devices can be used as a graphic display, a television monitor, or a surface light source. Further, because the organic electro-luminescence display devices are slim, lightweight and elegant in color vision, they are suitable for a next-generation flat panel display device.

A passive matrix type driving method is widely used for driving the organic electro-luminescence display devices, which does not require thin film transistors (TFTs). The passive matrix type driving method, however, has many limitations in resolution, power consumption, lifetime, and so on. Therefore, an active matrix type driving method has been researched and developed for a next-generation display device that requires a high resolution and large-size screen.

Hereinafter, an organic electro-luminescence display device according to the related art will be described with reference to the accompanying drawings.

Figure 1:
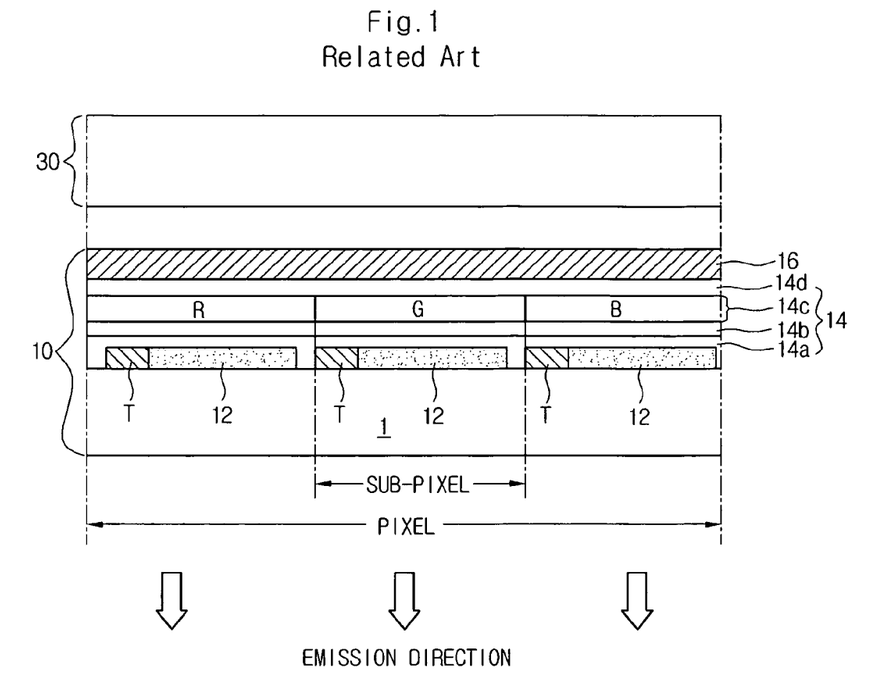
FIG. 1 is a schematic sectional view of an organic electro-luminescence display device according to the related art.

FIG. 1 is a schematic sectional view of an active matrix type organic electro-luminescence display device according to the related art. For convenience's sake, one pixel region including a red (R) sub-pixel, a green (G) sub-pixel, and a blue (B) sub-pixel is illustrated in FIG. 1.

Referring to FIG. 1, first and second substrates 10 and 30 are arranged to face each other. A TFT T is formed on a transparent substrate 1 of the first substrate 10 in each sub-pixel. An organic electro-luminescent layer 14 is formed on the TFT T and the first electrode 12. The organic electro-luminescent layer 14 contains light emission materials to display red, green and blue colors. A second electrode 16 is formed on the organic electro-luminescent layer 14. The first and second electrodes 12 and 16 apply an electric field to the organic electro-luminescent layer 14. The first substrate 10 on which the organic electro-luminescent layer 14 is formed is attached to the second substrate 30.

The active matrix type organic electro-luminescence display device illustrated in FIG. 1 has a bottom emission type structure. When the first electrode 12 and the second electrode 16 are respectively used as an anode and a cathode, the first electrode 12 is formed of a transparent conductive material and the second electrode 16 is formed of a metal having a low work function. Under this condition, the organic electro-luminescent layer 14 includes a hole injection layer 14a, a hole transporting layer 14b, an emission layer 14c and an electron transporting layer 14d, which are sequentially formed on the first electrode 12. The light-emitting materials for red, green and blue colors are arranged in the emission layers 14c of the sub-pixels.

In the organic electro-luminescence display device, the array element, including the TFT and the electrodes, and the organic electro-luminescent diode are stacked on the same substrate. The organic electro-luminescence display device is fabricated by attaching the substrate, on which the array element and the organic electro-luminescent diode are formed, to a separate substrate provided for encapsulation. In this case, the yield of the organic electro-luminescence display device is determined by the product of the yields of the array element and the organic electro-luminescent diode. Therefore, the entire process yield is greatly restricted by the process of forming the organic electro-luminescent diode. For example, even if the array element is successfully formed, the organic electro-luminescence display device becomes defective, when the organic electro-luminescent layer, which is generally a thin film having a thickness of about 1000 Å, has a defect cased by a foreign particle or other factors.

In addition, the bottom emission type organic electro-luminescence display device according to the related art has limitation in aperture ratio, although it has a high stability and high degree of freedom due to the encapsulation. Thus, it is difficult for the bottom emission type organic electro-luminescence device to be used for a high-definition product.

As for the top emission type organic electro-luminescence devices according to the related art, the design of TFTs is easy and the aperture ratio is high. Thus, it is advantageous in view of the lifetime of the products. However, because the cathode is disposed on the organic electro-luminescent layer, material selection is restricted. As a result, the transmittance is limited and the luminous efficiency is degraded.

SUMMARY OF THE INVENTION

Accordingly, the present invention is directed to an organic electro-luminescence display device and a method for fabricating the same that substantially obviate one or more problems due to limitations and disadvantages of the related art.

An advantage of the present invention is to provide an organic electro-luminescence display device and a method for fabricating the same, in which electrodes can be separated from one another in sub-pixels without using a conventional reverse-taper-shape separator.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, an organic electro-luminance display device includes a first substrate and a second substrate; an array element on the first substrate, the array element including at least one thin film transistor (TFT) in each sub-pixel; a first electrode on the second substrate; a buffer on the first electrode including a first buffer at a boundary area of each sub-pixel and a second buffer at a stepped portion of the first buffer, wherein the buffer that includes the first and second buffers has a undercut structure; an emitting layer in each sub-pixel; a second electrode on the emitting layer; and a conductive spacer for electrically connecting the TFT to the second electrode.

In another aspect of the present invention, a method for fabricating an organic electro-luminance display device includes forming an array element on a first substrate, the array element including at least one TFT in each sub-pixel; forming a first electrode on a second substrate; forming a buffer on the first electrode, the buffer including a first buffer at an outer region partitioning each sub-pixel and a second buffer at a region including a stepped portion of the first buffer, wherein a undercut structure is formed by the first and second buffers; forming an organic electro-luminescent layer in each sub-pixel partitioned by the second buffer; forming a second electrode on the organic electro-luminescent layer; and attaching the first and second substrates together.

In a further aspect of the present invention, an organic electro-luminance display device includes a substrate having a plurality of pixel regions; a first electrode on the substrate; an organic electro-luminescent layer on the first electrode in each pixel region; a second electrode formed on the organic electro-luminescent layer in each pixel region; a first buffer on the first electrode, the first buffer surrounding a region in which the organic electro-luminescent layer and the second electrode are formed; and a second buffer formed at a stepped portion of the first buffer in a round taper shape.

In a further aspect of the present invention, a method for fabricating an organic electro-luminance display device includes providing a substrate having a pixel region; forming a first electrode on the substrate; forming a first buffer on the first electrode except for the pixel region; forming a second buffer at a stepped portion of the first buffer to surround the pixel region; forming a undercut structure by etching a portion of the first buffer that is not overlapped with the second buffer; forming an organic electro-luminescent layer in the pixel region; and forming a second electrode on the organic electro-luminescent layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 2:
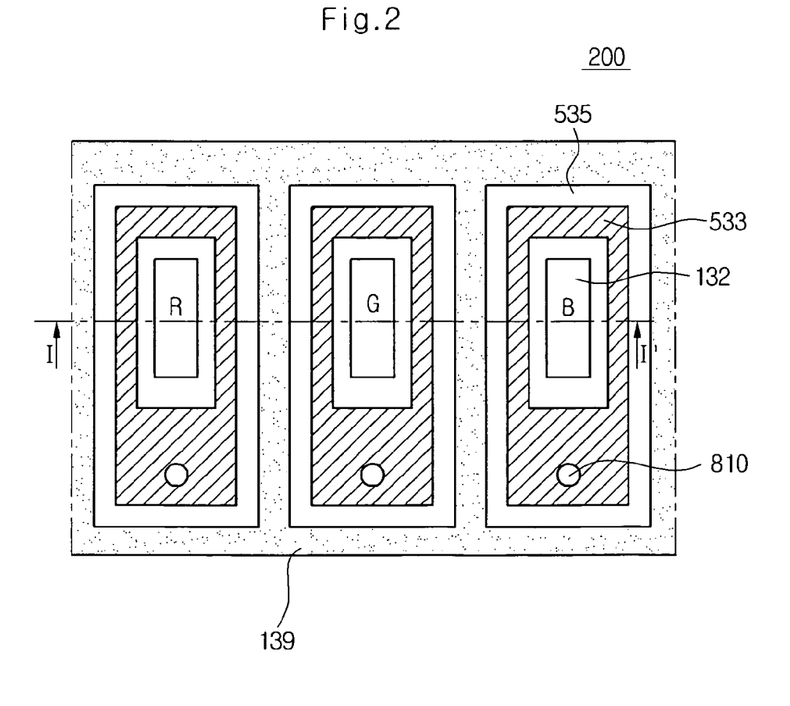
FIG. 2 is a plan view of an organic electro-luminescence display device according to a first embodiment of the present invention.
Figure 3:
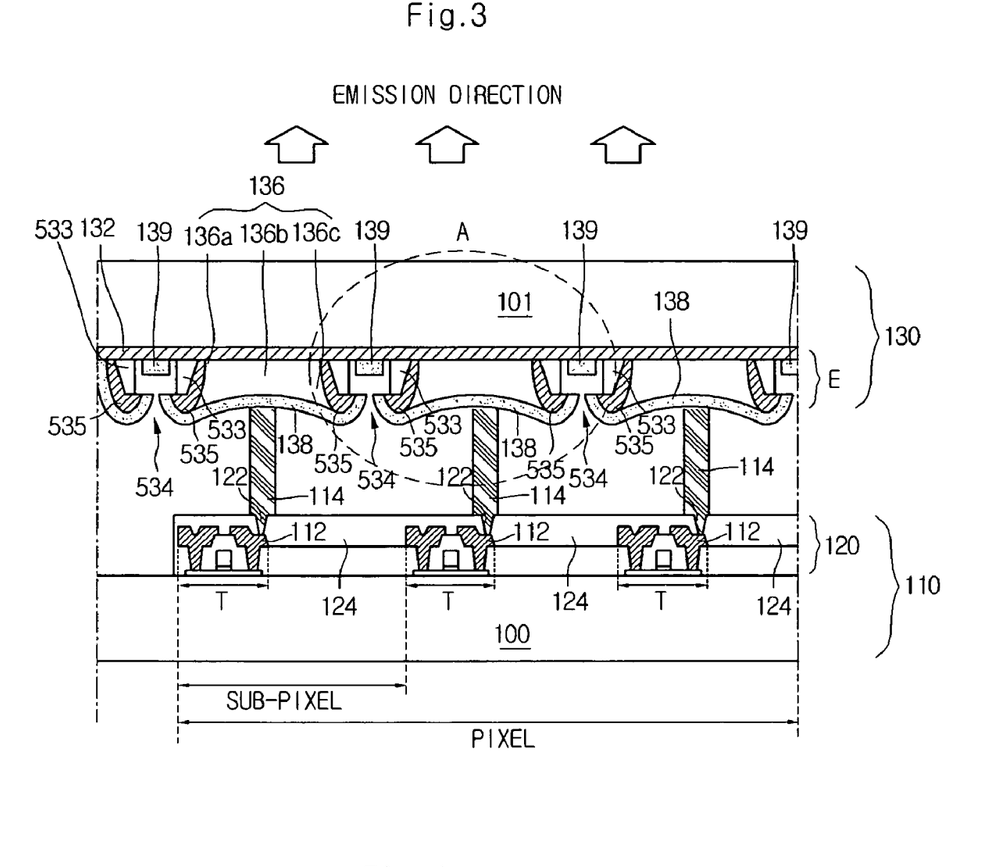
FIG. 3 is a sectional view taken along the line I-I' of FIG. 2.

FIG. 2 is a plan view of an organic electro-luminescence display device according to a first embodiment of the present invention, and FIG. 3 is a sectional view taken along the line I-I' of FIG. 2.

Referring to FIGS. 2 and 3, the organic electro-luminescence display device 200 includes an R sub-pixel, a G sub-pixel, and a B sub-pixel, which are arranged in a matrix configuration and constitute one pixel. The sub-pixels are separated from one another by a buffer layer that includes a first buffer 533 and a second buffer 535. Auxiliary electrodes 139 are arranged around the sub-pixels in a grid shape. The auxiliary electrodes 139 contact a first electrode 132 to commonly apply a voltage to the sub-pixels.

In FIG. 2, a reference numeral 810 refers to a spacer contact and its structure and function will be described later with reference to FIG. 8.

The buffer layer having the first and second buffers 533 and 535 is formed to have a undercut structure. The auxiliary electrodes 139, which are formed of the same material as a second electrode 138, is formed on the first electrode 132.

In the organic electro-luminescence display device 200, first and second substrates 110 and 130 are arranged spaced apart from each other by a predetermined distance. An array element 120 is formed on a transparent substrate 100 of the first substrate 110. Also, an organic electro-luminescent diode E is formed on an inner surface of a transparent substrate 101 of the second substrate 130.

The organic electro-luminescent diode E formed on the transparent substrate 101 of the second substrate 130 includes the first electrode 132, the first buffer 533 and the second buffer 535. The first electrode 132 serving as a common electrode is formed on the transparent substrate 101. The first buffer 533 is formed at an outer region partitioning each sub-pixel on the first electrode 132. The second buffer 535 is formed in a round taper shape at a region including a stepped portion of the first buffer 533.

Figure 4:
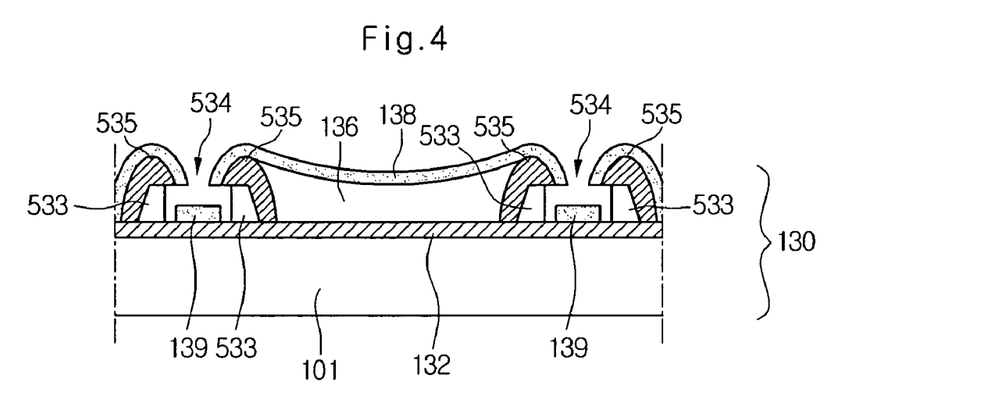
FIG. 4 is an enlarged view of a region A illustrated in FIG. 3.

A portion of the first buffer 533 that is not overlapped with the second buffer 535 is removed in a undercut structure to form a space 534. The space 534 separates the second electrode 138 of each sub-pixel, as illustrated in FIGS. 3 and 4. Thus, a reverse-taper-shaped separator, which is used in a conventional organic electro-luminescent display device to separate the second electrode of each sub-pixel, is not required.

The organic electro-luminescent diode E further includes an organic electro-luminescent layer 136. In each sub-pixel, the organic electro-luminescent layer 136 and the second electrode 138 are formed in sequence. That is, the organic electro-luminescent layer 136 and the second electrode 138 are formed in each sub-pixel and separated from those in neighboring sub-pixels by the first and second buffers 533 and 535.

The organic electro-luminescent layer 136 includes a first carrier transporting layer 136a, an emission layer 136b and a second carrier transporting layer 136c, which are stacked in sequence. The first and second carrier transporting layers 136a and 136c function to inject or transport electrons or holes into the emission layer 136b. The first and second carrier transporting layers 136a and 136c are determined by arrangement of anode and cathode electrodes. For example, when the emission layer 136b is formed of a high molecular compound and the first and second electrodes 132 and 138 are respectively configured as anode and cathode electrodes, the first carrier transporting layer 136a contacting the first electrode 132 has a stacked structure of a hole injection layer and a hole transporting layer, and the second carrier transporting layer 136c contacting the second electrode 138 has a stacked structure of an electron injection layer and an electron transporting layer.

The organic electro-luminescent layer 136 can be formed of a high molecular compound or low molecular compound by a vacuum deposition method or a solution casting method, such as an inkjet process, a printing process, a nozzle spraying process, a roll coating process, and the like. A vapor deposition method is generally used, when the organic electro-luminescent layer 136 is formed of a low molecular compound. Meanwhile, when the organic electro-luminescent layer 136 is formed of a high molecular compound, an inkjet process is generally used. Although an inkjet process is used to form the organic electro-luminescent layer 136 in the present invention, it should be appreciated that various methods including the above-described methods can be employed to form the organic electro-luminescent layer 136.

The array element 120 of the first substrate 110 includes TFTs T. In order to supply a current to the organic electro-luminescent diode E, a cylindrical conductive spacer 114 is disposed at a position where the second electrode 138 and the TFTs T are connected to each other in each sub-pixel. The conductive spacers 114, which have a constant height, electrically connect the two substrates and maintain a cell gap between the two substrates. That is, the conductive spacer 114 electrically connects a drain electrode 112 of the TFT T provided on the first substrate 110 in each sub-pixel with the second electrode 138 provided on the second substrate 130. The conductive spacer 114 is formed by coating a cylindrical spacer formed of an organic insulating layer with a metal. Because of the conductive spacer 114, pixels of the first and second substrates 110 and 130 are attached in a one-to-one correspondence, such that a current can flow therethrough.

The connection portion between the conductive spacer 114 and the TFT T will now be described in more detail.

A passivation layer 124 is formed at a region covering the TFT T. The passivation layer 124 includes a drain contact hole 122 that exposes a portion of the drain electrode 112. The conductive spacer 114 is formed on the passivation layer 124 and is connected to the drain electrode 112 through the drain contact hole 122. Here, the TFT T corresponds to a drive TFT connected to the organic electro-luminescent diode E. The conductive spacer 114 beneficially includes a conductive material such as metal having ductility and low specific resistance. The conductive spacer 114 may be formed either on the first substrate 110 or on the second electrode 138 of the second substrate 130.

Because the organic electro-luminescent display device is a top emission type, the organic electro-luminescent layer 136 emits light toward the second substrate 130. Beneficially, the first electrode 132 is selected from transparent conductive materials, while the second electrode 138 is selected from opaque metal materials.

Although not shown in the drawings, the array element 120 further includes a scan line, a signal line and a power line crossing with the scan line and spaced apart from each other by a predetermined distance. The array element 120 further includes a switching TFT disposed at an overlapped portion of the scan line and the signal line, and a storage capacitor.

The organic electro-luminescence display device is a dual panel type where the second substrate 130 on which the electro-luminescent diode E is formed is attached to the first substrate 110 on which the array element 120 is formed. In other words, the array element 120 and the organic electro-luminescent diode E are constructed on different substrates. Therefore, unlike the case where the array element and the organic electro-luminescence device are formed on the same substrate, the yield of the organic electro-luminescent diode is not influenced by the yield of the array element and a high degree of freedom with respect to the arrangement of the TFTs can be obtained. Also, because the first electrode 132 of the organic electro-luminescent diode E is formed on the transparent substrate 101, a degree of freedom with respect to the first electrode can be increased compared with the related art structure in which the first electrode is formed on the array element.

In the top emission type organic electro-luminescence display device described above, the TFTs can be designed without considering aperture ratio, thereby increasing efficiency when forming the array element. Also, products having a high aperture ratio and high resolution can be produced. In addition, because the organic electro-luminescent display device is a dual panel type, an outer air can be blocked more effectively compared with the related art top emission type organic electro-luminescent display device, thereby enhancing stability of the product.

An inkjet process is used to form the organic electro-luminescent layer 136 formed of a high molecular compound. In such a case, it is beneficial to prevent the ink from overflowing the buffer and to adjust the profile and thickness of the film by confining the high molecular compound within the emission region of the buffer. To this end, a hydrophobicity process is generally performed using plasma.

As described above, because the second buffer 535 surrounds the first buffer 533 and the first buffer 533 is etched in a undercut structure, it is possible to prevent the ink of a high molecular compound from flowing into the stepped portion of the first buffer 533 during the inkjet process. Therefore, the organic electro-luminescent layer 136 can be uniformly formed in each sub-pixel.

The structure of the first and second buffers 533 and 535 will be described in detail with reference to FIG. 4.

FIG. 4 is an enlarged view of a region A illustrated in FIG. 3.

Referring to FIG. 4, the first electrode 132 of the organic electro-luminescent diode E is formed on the transparent substrate 101 of the second substrate 130, which is the top substrate of the organic electro-luminescence display device. The first buffer 533 is formed at an outer region partitioning the sub-pixels on the first electrode 132. The second buffer 535 is formed at a region including the stepped portion of the first buffer 533. That is, the second buffer 535 is formed in a well structure surrounding the organic electro-luminescent layer 136.

In addition, a portion of the first buffer 533 that is not overlapped with the second buffer 535 is removed in a undercut structure during a plasma etching process. As a result, the adjacent sub-pixels are separated from one another. That is, due to the space 534 formed by the undercut structure, the second electrodes 138 formed on the organic electro-luminescent layers 136 in the sub-pixels are separated from one anther. Therefore, the space 534 can serve as a separator without providing a reverse-taper-shape separator that is used for a conventional organic electro-luminescent display device. Because the conventional separator is not formed, the fabricating process can be simplified and the width of the sub-pixels can be increased, thereby improving the aperture ratio.

Also, the auxiliary electrode 139 is formed on the first electrode 132 in the space 534 formed by the undercut structure. The auxiliary electrode 139 is formed during the process of forming the second electrode 138. The auxiliary electrode 139 reduces the resistance of the first electrode 132. Specifically, at least one surface of the first buffer 533 is formed inwardly from the second buffer 535 with a gap greater than 0.1 μm.

The second buffer 535 having a well structure is formed in a region including the stepped portion of the first buffer 533. Thus, the hydrophobicity process on the side surfaces prevents the ink of a high molecular compound from being attracted toward the stepped portion of the first buffer 533 and flowing therein. In this way, the second buffer 535 can obtain a shielding effect.

As a result, the present invention can solve the above-described problems caused by the overflow of the ink between the sub-pixels, a blackening phenomenon caused by the connection between the second electrodes 138, and a difficulty in adjusting the thickness of the organic electro-luminescent layer by forming the second buffer 535 at a region including the stepped portion of the first buffer 533. Accordingly, the picture quality of the organic electro-luminescence display device can be improved.

The organic electro-luminescent layers 136 are formed at the regions partitioned by the second buffers 535 in the sub-pixels, and the second electrodes 138 are formed on the organic electro-luminescent layer 136.

Figure 5:
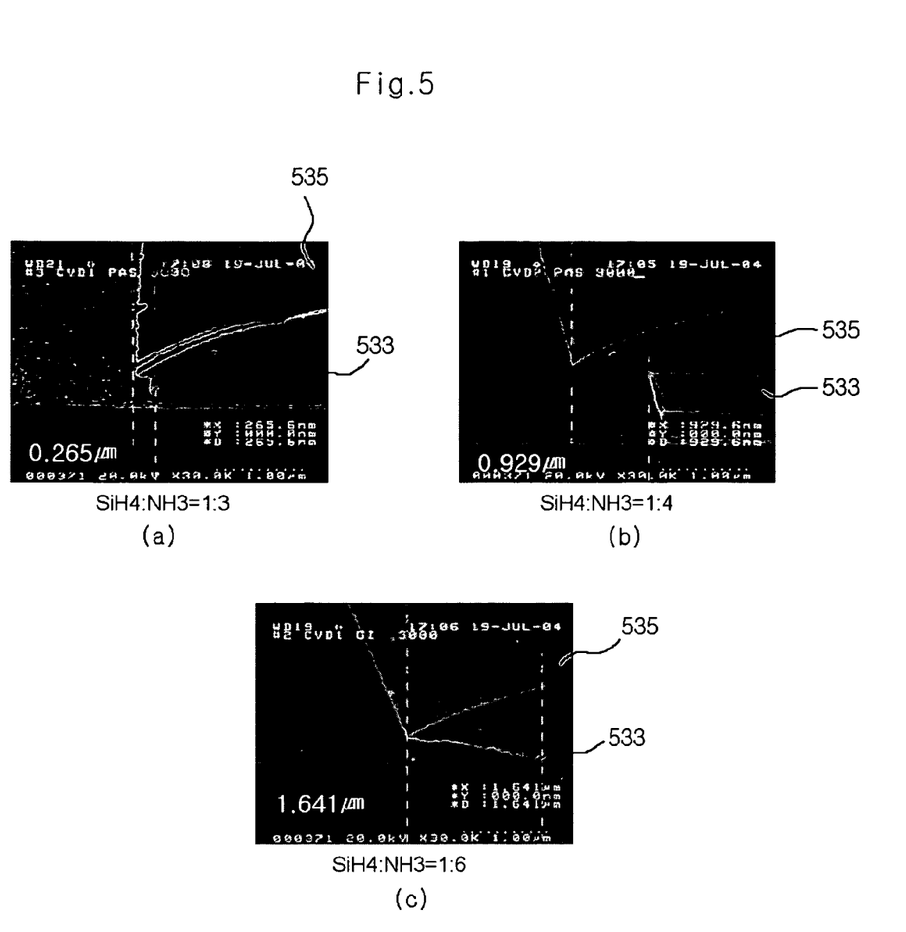
FIG. 5 is photographs illustrating depths of the undercut of a buffer according to composition ratios of silane and ammonia.

FIG. 5 is photographs showing the depths of the undercut of the buffer according to composition ratios of silane and ammonia.

Referring to FIG. 5, silicon nitride used as a material of the first buffer 533 is formed by a chemical reaction between silane ($SiH_4$) and ammonia ($NH_3$). The depth d of the undercut formed in the first buffer 533 is different depending on the composition ratio of silane and ammonia. That is, when silicon nitride is etched by plasma, the etched depth of the undercut varies depending on the composition ratio of silane and ammonia.

Specifically, as shown in FIG. 5(a), when the composition ratio of silane to ammonia is 1:3, the depth of the undercut of the first buffer 533 is about 0.265 μm. As shown in FIG. 5(b), when the composition ratio of silane to ammonia is 1:4, the depth of the undercut of the first buffer 533 is about 0.929 μm. Also, as shown in FIG. 5(c), when the composition ratio of silane to ammonia is 1:6, the depth of the undercut of the first buffer 533 is about 1.641 μm. That is, when the first buffer 533 is etched using plasma in which the amount of the ammonia component is at least two times the amount of the silane component, the first buffer 533 has a undercut.

Hereinafter, a method for fabricating an organic electro-luminescence display device according to an embodiment of the present invention will be described in detail.

Figure 6A:
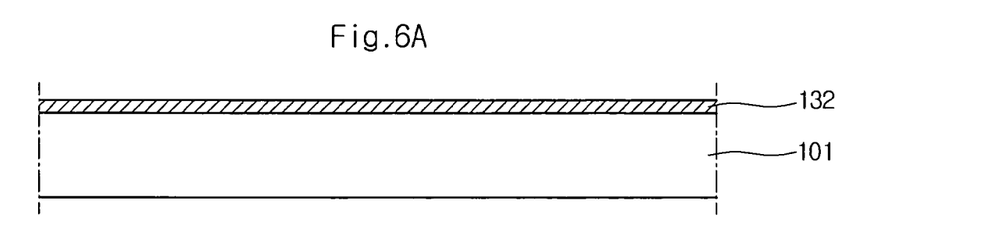
FIGS. 6A to 6F are sectional views illustrating a method for fabricating the organic electro-luminescence display device according to the first embodiment of the present invention.
Figure 6B:
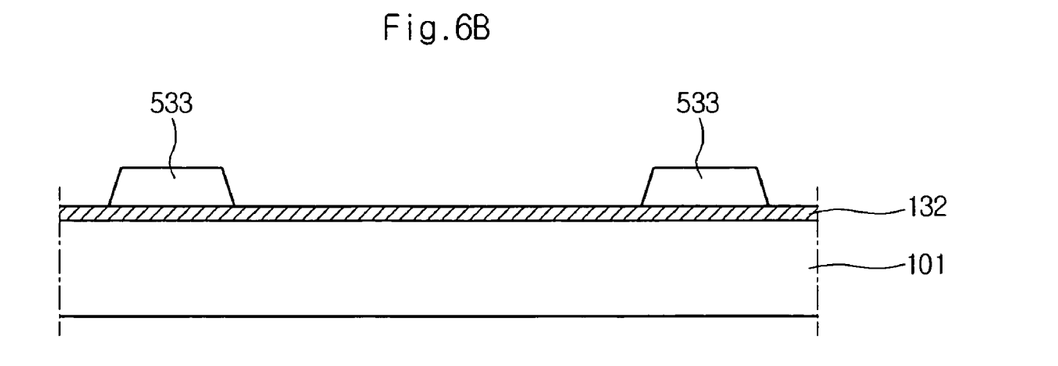
Figure 6C:
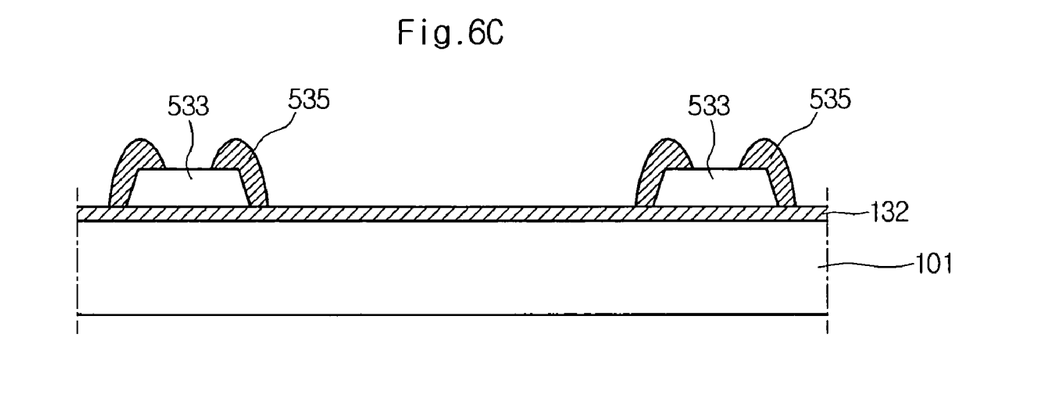
Figure 6D:
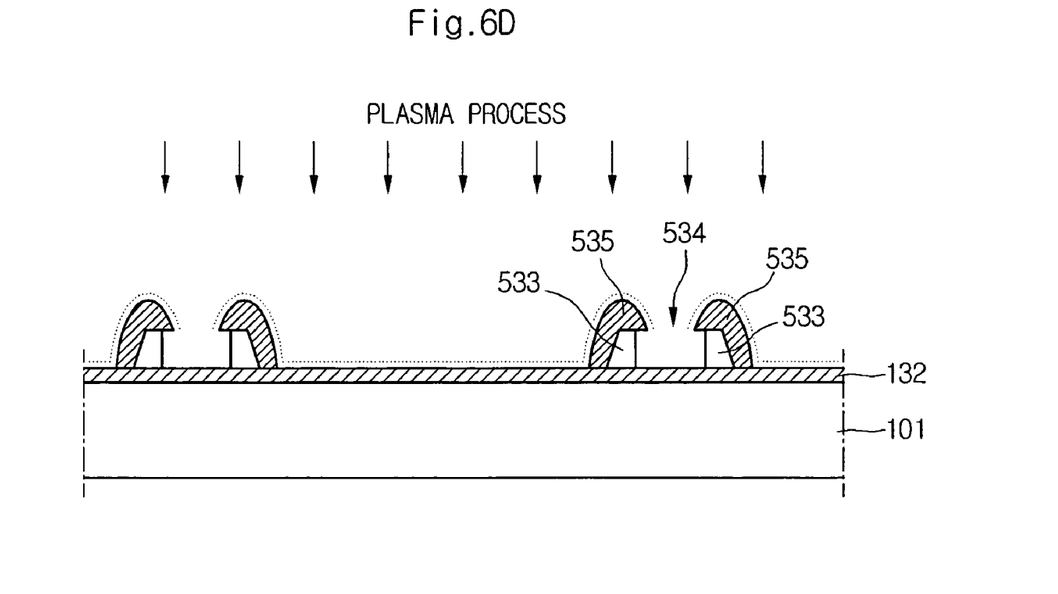
Figure 6E:
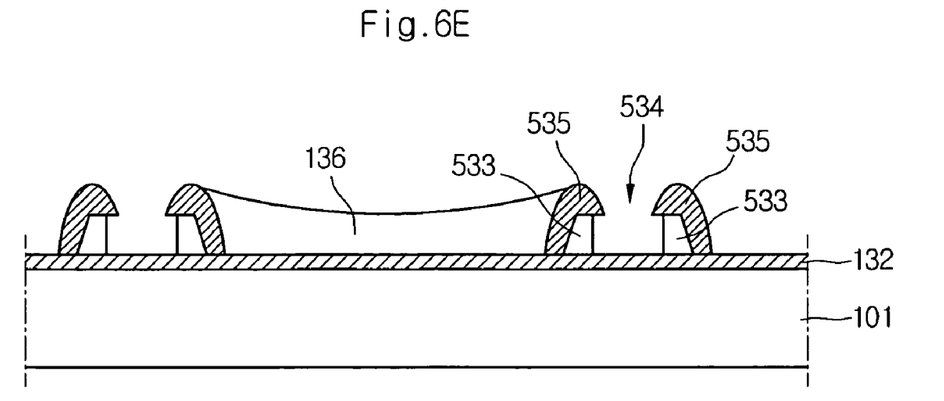
Figure 6F:
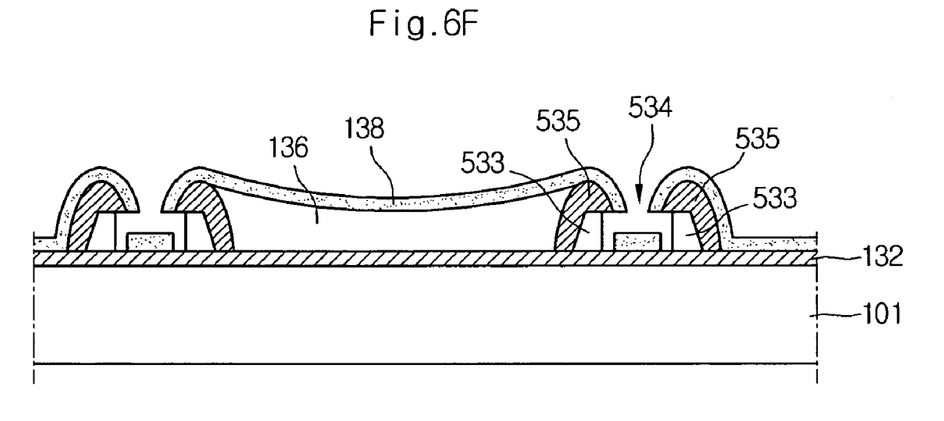
Figure 7:
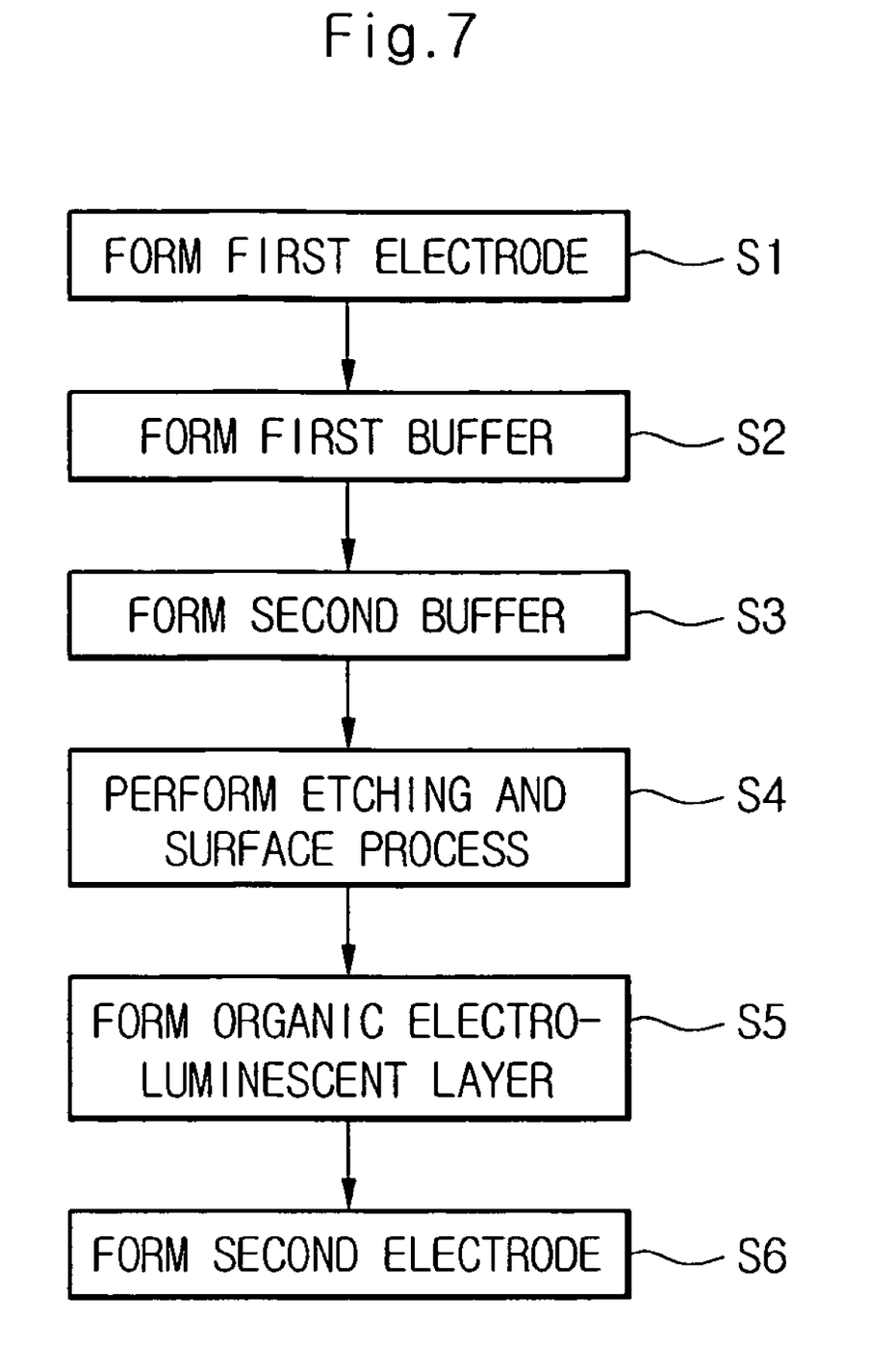
FIG. 7 is a flowchart illustrating a method for fabricating the organic electro-luminescence display device according to the first embodiment of the present invention.

FIGS. 6A to 6F are sectional views illustrating a method for fabricating an organic electro-luminescence display device according to the first embodiment of the present invention, and FIG. 7 is a flowchart illustrating a method for fabricating the organic electro-luminescence display device according to the first embodiment of the present invention.

Referring to FIG. 6A, in operation S1, a transparent substrate 101 having a plurality of sub-pixels arranged in a matrix configuration is prepared, and a transparent conductive metal such as indium tin oxide (ITO) is deposited on an entire surface of the transparent substrate 101, thereby forming a first electrode 132.

Referring to FIG. 6B, in operation S2, silicon oxide ($SiO_2$) or silicon nitride ($SiN_x$) is deposited on the transparent substrate 101 on which the first electrode 132 is formed. Then, a first buffer 533 is formed by patterning the deposited layer using a photo process and an etching process. The first buffer 533 is formed at a region partitioning the sub-pixel.

Referring to FIG. 6C, in operation S3, a material (e.g., polyimide-based material) different from the first buffer 533 is deposited on an entire surface of the transparent substrate 101 including the first buffer 533, and is patterned using a photo process and an etching process. As a result, a second buffer 535 is formed at a region including a stepped portion of the first buffer 533. That is, the second buffer 535 is formed in a well structure to surround the sub-pixel region in which an organic electro-luminescent layer will be formed. Accordingly, a upper central portion of the first buffer 533 is not covered by the second buffer 535 and is exposed to the outside.

In addition, the second buffer 535 is formed in a well structure (or a round taper shape) at a region including the stepped portion of the first buffer 533. Therefore, the hydrophobicity process on the side surfaces prevents the ink of a high molecular compound from being attracted toward the stepped portion of the first buffer 535 and flowing therein.

Referring to FIG. 6D, in operation S4, the exposed central portion of the first buffer 533 is etched using the second buffer 535 as a mask. The etching process is performed in such a way to form a undercut structure in the first buffer 533 and a space 534 in the central portion of the first buffer 533, thereby exposing the first electrode 132.

A dry etching using plasma is beneficially used for the etching process. When the first buffer is formed of a silicon nitride based material, the dry etching uses a mixture of oxygen and a fluorine based gas such as $CF_4$ and $SF_6$. In such a case, the dry etching process performs both the etching of the first buffer 533 to form a undercut structure and the hydrophobicity process on the surfaces of the second buffer 535. As describe above with reference to FIG. 5, the composition of silicon nitride of the first buffer 533 should be determined to form a desired-size of a undercut in the buffer. Beneficially, at least one surface of the first buffer 533 is formed inwardly from the second buffer 535 with a gap greater than 0.1 μm. In addition, a hydrophilic process may be performed using oxygen plasma before the dry etching process.

Because plasma is used to etch the first buffer 533 and is also applied to surfaces of the first electrode 132 and the second buffer 535, the surface of the first electrode 132 becomes hydrophilic and the surface of the second buffer 535 becomes hydrophobic.

As described in FIG. 5, when the first buffer 533 is formed of silicon nitride, the depth of the undercut can be controlled according to the composition ratio of silane to ammonia. By forming the first buffer 533 of silicon nitride having a predetermined composition ratio, the etching process and hydrophobicity process can be simultaneously performed during the plasma dry etching process.

Alternative methods for forming a undercut structure and performing a surface treatment will be described. In these examples, the first buffer 533 is formed of either silicon nitride ($SiN_x$) or silicon oxide ($SiO_2$), and the second buffer 535 is beneficially formed of an organic material or an inorganic material different from the first buffer 533.

First, when the first buffer 533 is formed of silicon nitride ($SiN_x$), a plasma dry etching process forms a undercut structure at the exposed first buffer 533 and performs the hydrophobicity process on the second buffer 535 at the same time. That is, the exposed surface of the first buffer 533 formed of silicon nitride ($SiN_x$) is removed to form a undercut structure by an etching process using a mixture of oxygen and a fluorine based gas after an oxygen surface treatment.

Second, when the first buffer is formed of silicon oxide ($SiO_2$), a separate wet etching process is performed to form a undercut structure at the exposed first buffer 533. That is, the undercut structure can be formed by wet-etching the exposed surface of the first buffer 533 that is not overlapped with the second buffer 535. In this case, an additional hydrophobicity process is generally required after the wet-etching process.

Referring to FIG. 6E, in operation S5, an organic electro-luminescent layer 136 is formed on the first electrode 132 in each sub-pixel by using an inkjet deposition apparatus (not shown). The organic electro-luminescent layer 136 produces any one of R, G and B colors, and is formed of a high molecular material or low molecular material.

When the organic electro-luminescent layer 136 is formed of a high molecular material and the first and second electrodes 132 and 138 are the anode and the cathode, respectively, the organic electro-luminescent layer 136 includes a hole transporting layer, an emission layer and an electron transporting layer, which are stacked in sequence. The hole/electron transporting layers are used to inject holes or electrons into the emission layer and transport them. The hole transporting layer contacting the first electrode 132 has a stacked structure of the hole injection layer and the hole transporting layer, and the electron transporting layer contacting the second electrode 138 has a stacked structure of the electron injection layer and the electron transporting layer.

As described above, during the process of forming the undercut structure, the surface of the first electrode 132 becomes hydrophilic and the surface of the second buffer 535 becomes hydrophobic. Therefore, the organic electro-luminescent layer 136 formed by the inkjet method has a good cohesive force with the surface of the first electrode 132 and a bad cohesive force with the surface of the second buffer 535. Due to this surface characteristic, the organic electro-luminescent layer 136 can be uniformly formed on the first electrode 132 in each sub-pixel.

Referring to FIG. 6F, in operation S6, a metal layer is deposited on an entire surface of the transparent substrate 101 on which the organic electro-luminescent layer 136 is formed to form a second electrode 138 serving as a cathode. The metal layer can be formed of gallium, magnesium, aluminum, or the like.

Due to the undercut structure, the second electrodes 138 formed on the organic electro-luminescent layers of the sub-pixels are not connected to one another. That is, the second electrodes 138 in the sub-pixels are separated from one another by the space 534 disposed between the second buffers 535. Therefore, each sub-pixel has an independent second electrode 138 and the space 534 serves as a separator without providing a conventional reverse-taper-shape separator.

In forming the second electrode 138, an auxiliary electrode 139, which is formed of the same material as the second electrode 138, is formed on the first electrode 132 in the space 534 of the undercut region. The auxiliary electrode 139 is electrically connected to the first electrode 132 and thus reduces the resistance of the first electrode 132.

Figure 8:
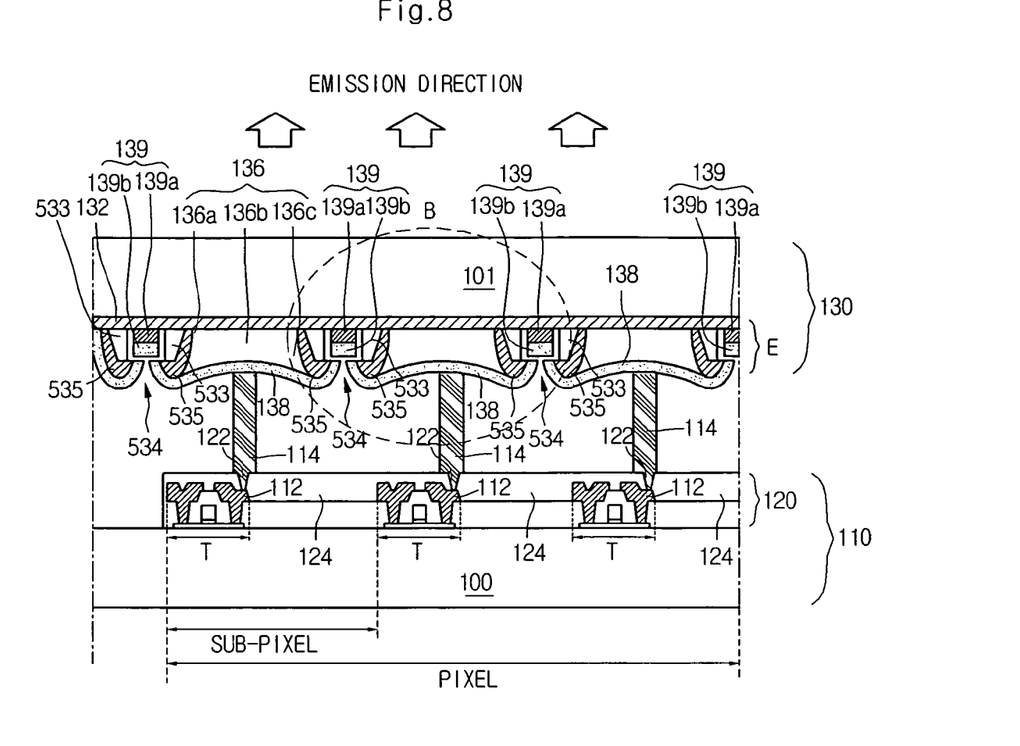
FIG. 8 is a plan view of an organic electro-luminescence display device according to a second embodiment of the present invention.
Figure 9A:
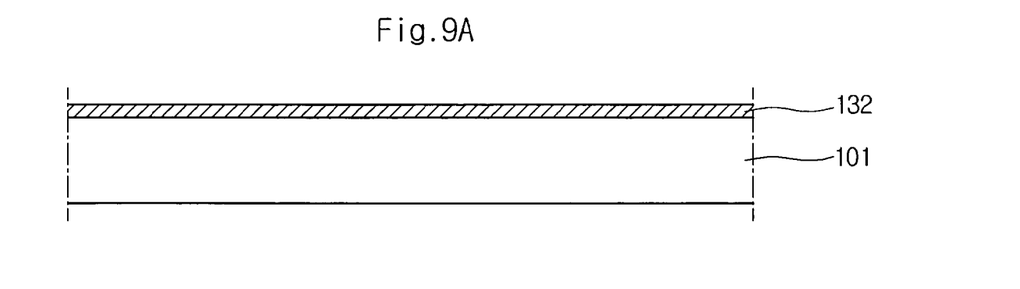
FIGS. 9A to 9G are sectional views illustrating a method for fabricating the organic electro-luminescence display device according to the second embodiment of the present invention.
Figure 9B:
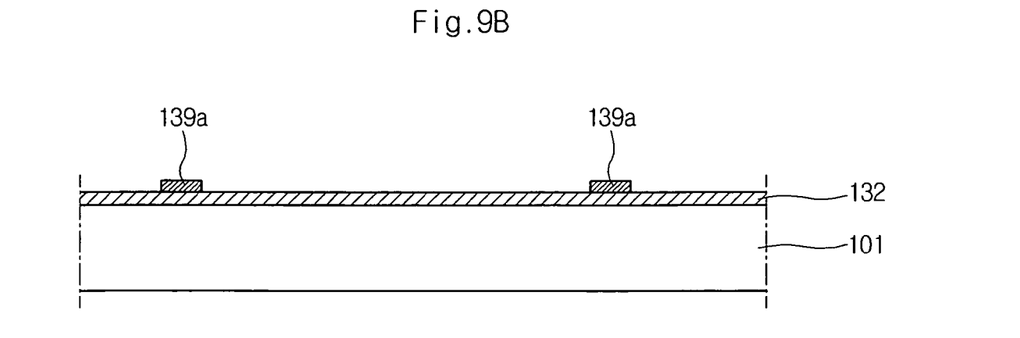
Figure 9C:
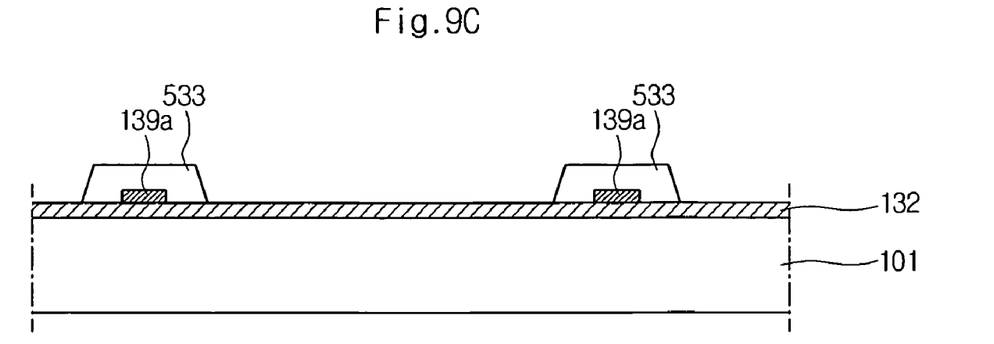
Figure 9D:
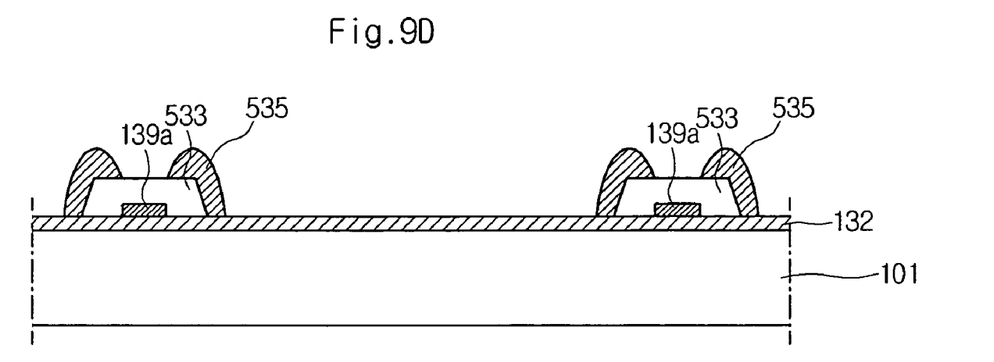
Figure 9E:
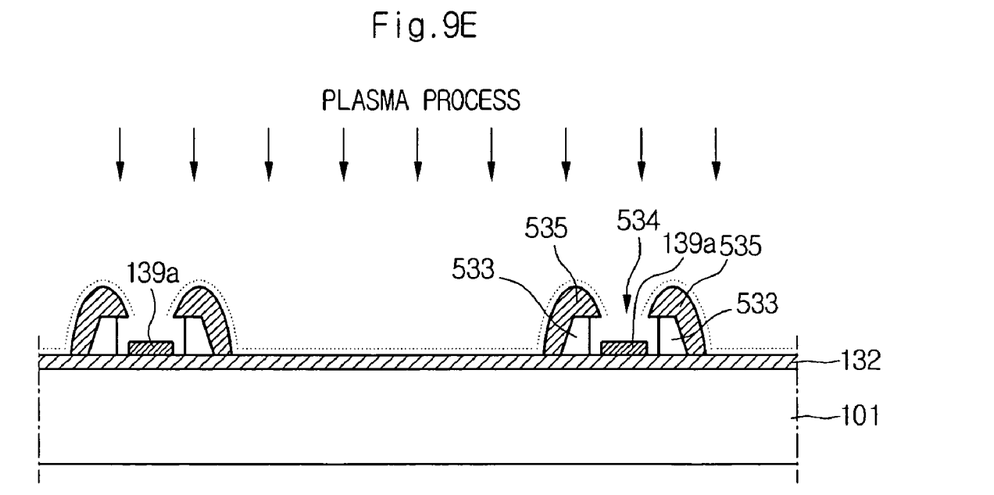
Figure 9F:
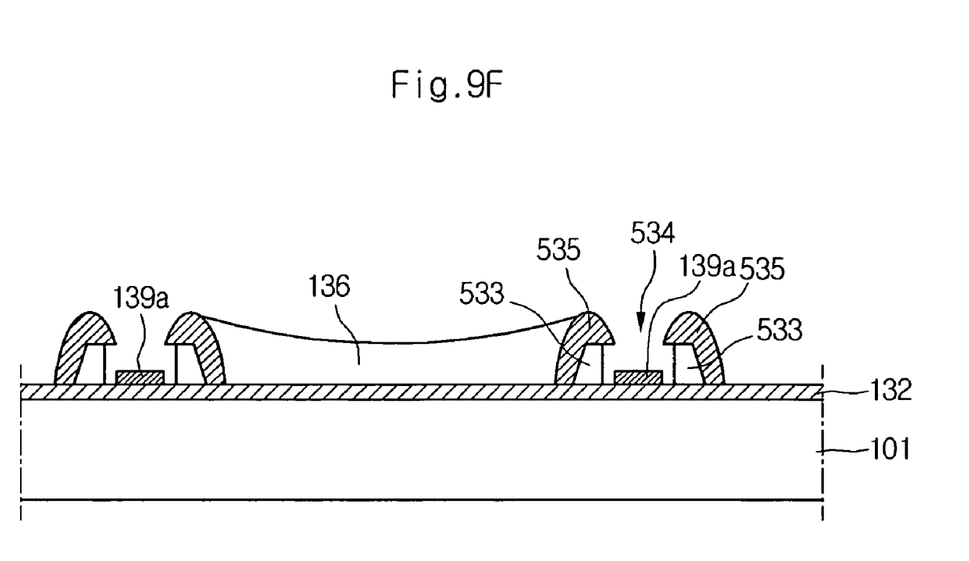
Figure 9G:
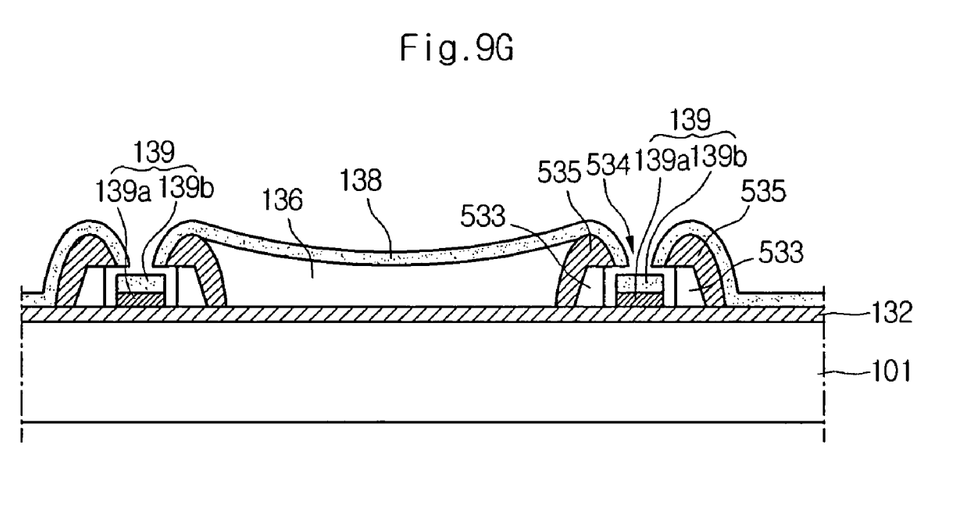

FIG. 8 is a plan view of an organic electro-luminescence display device according to a second embodiment of the present invention, and FIGS. 9A to 9G are sectional views illustrating a method for fabricating the organic electro-luminescence display device according to the second embodiment of the present invention. Since the structure of the organic electro-luminescence display device in FIG. 8 is similar to that of FIGS. 3 and 6A to 6F, a description thereof will be made centering on different parts.

Referring to FIG. 8, the organic electro-luminescence display device includes R, G and B sub-pixels arranged in a matrix configuration that constitute one pixel. The sub pixels are separated from one another by a buffer layer. Also, the buffer layer includes a first buffer 533 and a second buffer 535. Auxiliary electrodes 139 are arranged around the sub-pixels in a grid shape. The auxiliary electrodes 139 electrically contact a first electrode 132 to commonly apply a voltage to the sub-pixels. Each of the auxiliary electrodes 139 includes a first auxiliary electrode 139a and a second auxiliary electrode 139b.

The first buffer 533 formed inside the second buffer 535 has a undercut structure, as in the first embodiment. However, a stacked structure of the first and second auxiliary electrodes 139a and 139b is formed on the first electrode 132 exposed to the outside by the undercut structure.

As described above, a vapor deposition method is generally used to form an organic electro-luminescent layer 136 of a low molecular compound. In such a case, an insulating layer may be formed between the first electrode 132 and the auxiliary electrode, which prevents reducing the resistance of the first electrode 132. For this reason, the auxiliary electrode 139 of the second embodiment has a stacked electrode structure of the first and second auxiliary electrodes 139a and 139b.

A method of fabricating the organic electro-luminescence display device according to the second embodiment of the present invention will be described below with reference to FIGS. 9A to 9G.

Referring to FIGS. 9A to 9G, a first electrode 132 is formed on a transparent substrate 101 with a plurality of sub-pixels arranged in a matrix configuration, and a first auxiliary electrode 139a is formed at a region partitioning the sub-pixels. The first auxiliary electrode 139a is formed of metal having a high conductivity to reduce the resistance of the first electrode 132 formed of a transparent conductive metal.

After forming the first auxiliary electrode 139a, a first buffer 533 of silicon oxide ($SiO_2$) or silicon nitride ($SiN_x$) is formed on the first auxiliary electrode 139a using.

Then, a material (e.g., a polyimide-based material) different from the first buffer 533 is deposited on an entire surface of the transparent substrate 101 and patterned to form a second buffer 535 at a region including a stepped portion of the first buffer 533. Since the subsequent processes are similar to those of FIGS. 6B to 6F, a detailed description thereof will be omitted for conciseness.

Accordingly, the first electrode 132 and the first auxiliary electrode 139a formed under the first buffer 533 are exposed to the outside due to a undercut structure.

Then, an organic electro-luminescent layer 136 is formed on the first electrode 132 exposed in the sub pixel region, and a metal layer is deposited on an entire region of the transparent substrate 101 to thereby form a second electrode 138 on the organic electro-luminescent layer 136. At this time, the materials of the first and second buffers 533 and 535, the process for forming the undercut structure and the hydrophobicity process are identical to those described with reference to FIGS. 6A to 6F.

When the second electrode 138 is formed, a portion of the second electrode 138 is formed within the undercut structure to form a second auxiliary electrode 139b. Accordingly, due to the undercut structure, the two auxiliary electrodes 139a and 139b are formed on the first electrode 132 in the first buffer 533.

As described above, an insulating layer may be formed on the first auxiliary electrode 139a. Therefore, even though the second auxiliary electrode 139b does not electrically contact the first electrode 132, the first auxiliary electrode 139a can reduce the resistance of the first electrode 132.

In the second embodiment, the first electrode 132 is formed on the transparent substrate 101 and then the first auxiliary electrode 139a is formed on the first electrode 132. However, it should be appreciated that the order can be reversed. That is, the first auxiliary electrode 139a can be formed on the transparent substrate 101 and then the first electrode 132 can be formed on the first auxiliary electrode 139a.

Figure 10:
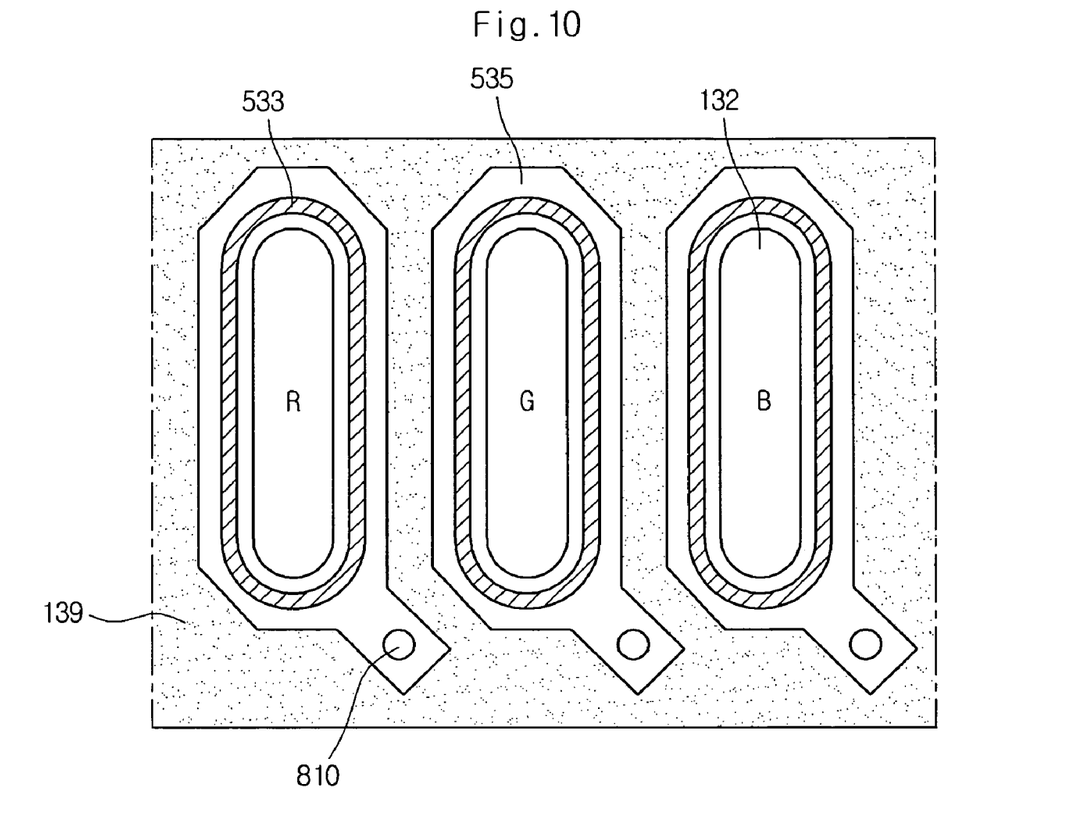
FIG. 10 is a plan view of an organic electro-luminescence display device according to a third embodiment of the present invention.

FIG. 10 is a plan view of an organic electro-luminescence display device according to a third embodiment. In FIG. 10, only one pixel region (that is, three sub-pixels) is illustrated for conciseness. It should be appreciated that the embodiment described with reference to FIG. 10 is an exemplary embodiment of the present invention and various modifications are possible in accordance with the principles of the present invention.

The structural differences between the organic electroluminescence display device of FIG. 10 and that of FIG. 2 will now be described.

Referring back to FIG. 2, the sub-pixels are partitioned and separated from one another by the first buffers 533 and the second buffers 535. Specifically, the second buffer 535 is formed at a region including a stepped portion of the first buffer 533. The second buffer 535 is formed in a well structure surrounding the organic electro-luminescent layer. Also, the auxiliary electrodes 139 are formed between the sub-pixels in a grid shape. The auxiliary electrodes 139 electrically contact the first electrode 132 to reduce the resistance of the first electrode 132.

Referring to FIG. 10, each of the sub-pixels includes a first buffer 533 having a polygonal structure, a second buffer 535 formed at a region including a stepped portion of the first buffer 533, and a conductive space contacting part 810 disposed at a region protruded from one side of the polygonal first buffer 533 and electrically connected to the array element of the first substrate. The corners of the sub-pixels are rounded and the edges are disposed within a region partitioned by the second buffer 535. Due to a undercut structure, second electrodes formed in the sub-pixels are electrically separated from one another. The undercut structure is formed corresponding to the exposed portion of the first buffer 533. Therefore, the sub-pixels can be independently driven.

In the third embodiment of FIG. 10, in order not to position the conductive space contacting part 810 within the sub-pixel region, the first and second substrates may be misaligned by a predetermined distance and attached to each other.

The undercut structure can be formed by a dry etching. The depth of the undercut can be controlled by the composition of silicon nitride, which in turn can be controlled by the composition ratio of silane and ammonia during the deposition of silicon nitride.

With the plasma dry etching process, the etching process for the undercut structure and the surface treatment can be performed at the same time, thereby simplifying the fabricating process and improving the processing yield. Also, because the conventional separator having a reverse taper shape is not required to separate the sub-pixels, the fabricating process can be further simplified and the width of the sub-pixels can be increased to thereby improve the aperture ratio.

In addition, because the conductive separating layer formed at the same time as the second electrode contacts the first electrode in the space of the exposed first buffer region, the resistance of the first electrode can be reduced. Also, the organic electro-luminescent layer of a high molecular compound can be uniformly formed because of the second buffer that has a round tapered shape and is formed at a region including the stepped portion of the first buffer. Moreover, the attraction effect of the ink can be reduced by removing the stepped portion of the buffer in the inkjet process, thereby increasing the jetting directionality margin.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro-luminance display device comprising:
    a first substrate and a second substrate;
    an array element on the first substrate, the array element including at least one thin film transistor(TFT) in each sub-pixel;
    a first electrode on the second substrate;
    a buffer on the first electrode including a first buffer at a boundary area of each sub-pixel and a second buffer at a stepped portion of the first buffer, wherein the buffer that includes the first and second buffers has a undercut structure;
    an emitting layer in each sub-pixel;
    a second electrode on the emitting layer; and
    a conductive spacer for electrically connecting the TFT to the second electrode,
    wherein the second buffer covers an entire upper surface of the first buffer.

2. The organic electro-luminance display device according to claim 1, wherein the first and second buffers are formed of different materials.

3. The organic electro-luminance display device according to claim 1, wherein the second buffer has a well structure surrounding the emitting layer.

4. The organic electro-luminance display device according to claim 1, wherein the organic electro-luminescent layer is formed of either a high molecular material or a low molecular material.

5. An organic electro-luminance display device comprising:
- a substrate having a plurality of pixel regions;
- a first electrode on the substrate;
- an organic electro-luminescent layer on the first electrode in each pixel region;
- a second electrode formed on the organic electro-luminescent layer in each pixel region;
- a first buffer on the first electrode, the first buffer surrounding a region in which the organic electro-luminescent layer and the second electrode are formed; and
- a second buffer formed in a round taper shape at a region including a stepped portion of the first buffer, wherein the second buffer covers an entire upper surface of the first buffer.

6. The organic electro-luminance display device according to claim 5, wherein the first and second buffers are formed in a undercut structure region in which a space is formed by removing a portion of the first buffer that is not overlapped with the second buffer.

7. The organic electro-luminance display device according to claim 5, wherein the first buffer is formed of one of silicon nitride and silicon oxide.

8. The organic electro-luminance display device according to claim 6, wherein, a size of the undercut structure varies depending on a composition ratio of silane to ammonia during a formation of the first buffer.

9. The organic electro-luminance display device according to claim 8, wherein an amount of ammonia is at least twice as much as an amount of silane.

10. The organic electro-luminance display device according to claim 6, wherein the space is formed by a dry etching process using plasma.

11. An organic electro-luminescence display device comprising:
- first and second substrates spaced apart from each other by a predetermined distance;
- an array element including at least one TFT (thin film transistor) formed on the first substrate in each sub pixel;
- a first electrode formed on the second substrate;
- a first buffer formed at a region partitioning each sub pixel disposed above the first electrode;
- a second buffer formed in a round taper shape at a region including a stepped portion of the first buffer;
- a undercut structure region formed by removing a portion of the first buffer that is not overlapped with the second buffer;
- an auxiliary electrode contacting the first electrode in the undercut structure region;
- an organic electro-luminescent layer formed in each sub pixel region surrounded by the second buffer;
- a second electrode formed on the second substrate on which the organic electro-luminescent layer is formed; and
- a conductive spacer for electrically connecting the TFT on the first substrate and the second electrode on the second substrate, the TFT and the second electrode corresponding to each other in the sub pixel,
- wherein the second buffer covers an entire upper surface of the first buffer.

12. The organic electro-luminescence display device according to claim 11, wherein the auxiliary electrode is a stacked structure including a first auxiliary electrode and a second auxiliary electrode, the first auxiliary electrode directly contacting the first electrode, the second auxiliary electrode being formed together with the second electrode.

* * * * *